(12) United States Patent
Campion et al.

(10) Patent No.: US 6,802,457 B1
(45) Date of Patent: Oct. 12, 2004

(54) COATINGS FOR USE IN FUEL SYSTEM COMPONENTS

(75) Inventors: Robert M. Campion, Normal, IL (US); Chuong Q. Dam, Peoria, IL (US); Kenneth W. Hall, East Peoria, IL (US); William J. Rodier, Metamora, IL (US)

(73) Assignee: Caterpillar Inc, Peoria, IL (US)

( * ) Notice: Subject to any disclaimer, the term of this patent is extended or adjusted under 35 U.S.C. 154(b) by 704 days.

(21) Appl. No.: 09/213,710

(22) Filed: Dec. 17, 1998

Related U.S. Application Data

(60) Provisional application No. 60/101,382, filed on Sep. 21, 1998.

(51) Int. Cl.[7] ............................................... F02M 47/02
(52) U.S. Cl. ...................................... 239/88; 239/533.2
(58) Field of Search .............................. 239/88, 533.2

(56) References Cited

U.S. PATENT DOCUMENTS

| | | | |
|---|---|---|---|
| 4,370,854 A | | 2/1983 | Williams |
| 4,426,162 A | * | 1/1984 | Tsuchiya et al. |
| 4,643,740 A | * | 2/1987 | Nicolson |
| 4,951,878 A | * | 8/1990 | Casey et al. ................. 239/462 |
| 5,226,975 A | * | 7/1993 | Denton et al. .............. 148/220 |
| 5,409,165 A | * | 4/1995 | Carroll, III et al. ........... 239/88 |
| RE34,956 E | * | 5/1995 | Djordjevic |
| 5,492,573 A | * | 2/1996 | Fukushima et al. ......... 148/326 |
| 5,641,121 A | * | 6/1997 | Beck et al. .................... 239/92 |
| 5,672,386 A | * | 9/1997 | Ooya |
| 5,673,618 A | * | 10/1997 | Little |
| 5,713,333 A | | 2/1998 | Cooper et al. |
| 5,773,734 A | * | 6/1998 | Young |
| 5,783,261 A | * | 7/1998 | Potter et al. ................. 427/526 |
| 5,843,571 A | | 12/1998 | Sho |
| 5,851,680 A | * | 12/1998 | Heau |

FOREIGN PATENT DOCUMENTS

| | | |
|---|---|---|
| DE | 362342134 A1 | 7/1986 |
| EP | 0 818 622 | 1/1998 |
| GB | 1275456 | 6/1999 |

\* cited by examiner

*Primary Examiner*—Christopher Kim
(74) *Attorney, Agent, or Firm*—Larry G Cain; Kathleen R Carey; Robert J Hampsch

(57) ABSTRACT

A coating for fuel system components, including components of fuel injectors, adapted for use with low lubricity fuels is disclosed. The invention consists of a metal carbon material coating or a metal nitride coating to the fuel pump plunger or other fuel injection system components. The invention utilizes a coating on the fuel injector plunger that minimizes scuffing or seizure associated with the plunger and barrel.

41 Claims, 3 Drawing Sheets

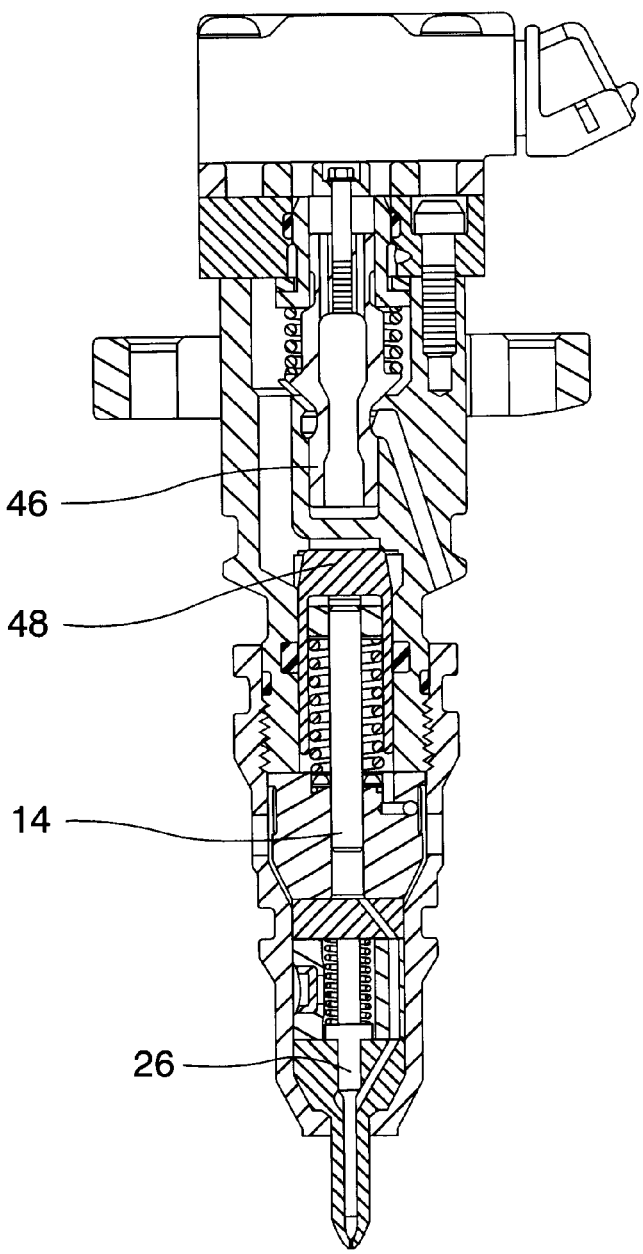
Fig_3_

COATINGS FOR USE IN FUEL SYSTEM COMPONENTS

The present invention relates to fuel system components, such as fuel injectors, and more particularly to coatings or surface treatments for fuel system components such as fuel injector plungers. This application claims the benefit of prior provisional patent application Ser. No. 60/101,382 filed Sep. 21, 1998.

FIELD OF THE INVENTION

The present invention relates to fuel injectors and more particularly to coatings or surface treatments for fuel injector components such as fuel injector plungers.

BACKGROUND OF THE INVENTION

Many internal combustion engines, whether compression ignition or spark ignition engines, are provided with fuel injection systems to satisfy the need for precise and reliable fuel delivery into the combustion chamber of the engine. Such precision and reliability is necessary to address the goals of increasing fuel efficiency, maximizing power output, and controlling undesirable by-products of combustion.

A fuel injector is a precision device that must meter the quantity of fuel required for each cycle of the engine and must develop the high pressure necessary to inject the fuel into the combustion chamber at the correct instant of the operating cycle. Many fuel injection units utilize a hydraulically actuated mechanism to pressurize the fuel charge to obtain the desired fuel spray pattern. The hydraulically actuated system operates on a fuel injection plunger that is disposed within a bore formed in the fuel injector for engaging a nearly incompressible liquid fuel. This mechanical pressurization of the liquid fuel produces an extremely high fuel injection pressure, often exceeding 140,000 MPa (20,000 psi).

Additionally, the hydraulically actuated electronically controlled unit injector often operates at a more severe condition than the mechanically actuated electronically controlled unit injector. The hydraulically actuated electronically controlled unit has a shorter fuel injector plunger and thus, a shorter engaged length in the mating barrel. Experimentation has shown the length of the hydraulically actuated electronically controlled unit injector's plunger engagement is about one-half of the mechanically actuated electronically controlled unit injector plunger.

The decreased surface area in which to spread out the contact stress causes the hydraulically actuated electronically controlled unit injector to experience increased wear at the contact surfaces relative to mechanically actuated electronically controlled unit injectors, which have considerably longer engaged length between the fuel injector plunger and the mating barrel. The hydraulically actuated electronically controlled unit injector requires a superior lubrication boundary layer to combat the higher contact stress.

The operability of a fuel injector is dependent, to some extent, on the fuel to be injected, and in particular on the lubricity, viscosity or other salient physical characteristics of the fuel to be injected. The use of low lubricity fuels, in particular, can cause several problems, most notably fuel injector plunger scuffing, and ultimately the seizure of the fuel injector plunger within the bore of the fuel injector. Scuffing is typically caused by lack of lubrication at the interface between two hard surfaces causing a welding or adhesion of the contacting parts, e.g. fuel injector plunger and fuel injector barrel sliding against one another without proper lubrication tend to show evidence of scuffing. Scuffing, which is a form of wear, will change the clearance between the plunger and the barrel and will make the surface rough so the sliding motion of the plunger will not be smooth, both of which will lead to an incorrect amount of fuel injected into the system. Eventually, continued scuffing can lead to seizure of the fuel injector plunger in the barrel as the plunger and barrel will effectively merge into one part with no movement allowed. As indicated above, scuffing of fuel injector components is particularly evident in fuel injection systems that utilize low lubricity fuels.

The aforementioned problems exist primarily, although not exclusively with low lubricity fuels and other non-standard fuels including gasoline, naphtha, D1 type diesel fuels, aviation fuels, blended or heavy fuels, crude oils or water/fuel emulsions, including water continuous and fuel continuous emulsions.

Various related art techniques have considered the use of titanium nitride (TiN) coatings on fuel injector plungers to reduce wear of the coated parts. The problem encountered with TiN coatings is that a TiN coating is usually applied at extremely high temperatures (e.g. about 450 degrees C.) which may produce unwanted thermal stresses and related failures to the fuel injector plunger. It is also believed that TiN coatings on fuel injector plungers tend to increase the wear of the plunger mating component at the mating or seating location. In addition, TiN coatings tend to increase the overall cost of the fuel injector plunger because the TiN coated fuel injector plunger requires tool grade steel to withstand the high temperatures observed in the application of the TiN coating.

Alternatively, several related art techniques have considered the use of ceramic materials as the base material for the fuel injector plunger instead of metal. Unfortunately, the use of a ceramic material for fuel injector plungers is very costly and the resulting monolithic ceramic fuel injector plungers have not typically demonstrated the necessary durability or reliability for commercial use in diesel engines or other heavy duty engine applications.

The present invention aids in overcoming one or more of the aforementioned fuel injector problems and the shortcomings of the related art solutions to such problems.

DISCLOSURE OF THE INVENTION

The invention may be characterized as a diamond like carbon coated low alloy steel component for a fuel injection system having improved boundary lubrication characteristics, and improved scuffing resistance characteristics are disclosed. The component comprises a steel substrate and a primary coating (e.g. tungsten carbide containing carbon) deposited on the substrate. The primary coating has a thickness generally no greater than about 5 microns.

In one aspect of the present invention, a process for increasing the boundary lubrication of low alloy steel lubricated contacts in a fuel injection system is disclosed. The process comprises the steps of preparing a low alloy steel substrate and then forming a metal nitride coating or diamond like carbon coating on the low alloy steel substrate using a low temperature physical vapor deposition process.

A further aspect of the invention is that the disclosed coatings or surface treatments of the fuel system component operate to augment the lubricity of certain low lubricity fuels. The disclosed coatings applied to the fuel injector plunger and the corresponding mating component (e.g. fuel injector barrel) can significantly reduce the possibility of lubricity related failures of the fuel injector. Utilization of such coatings on fuel injector system components can reduce or eliminate the need for adding lubricants to the low lubricity fuel compositions.

BRIEF DESCRIPTION OF THE DRAWINGS

FIG. 3 is a diagrammatic cross-sectional view of a hydraulically actuated electronically controlled unit injector.

BEST MODE FOR CARRYING OUT THE INVENTION

The following description is of the best mode presently contemplated for carrying out the invention. This description is not to be taken in a limiting sense, but is made merely for the purpose of describing the general principals of the invention. The scope and breadth of the invention should be determined with reference to the claims.

Figure 1:
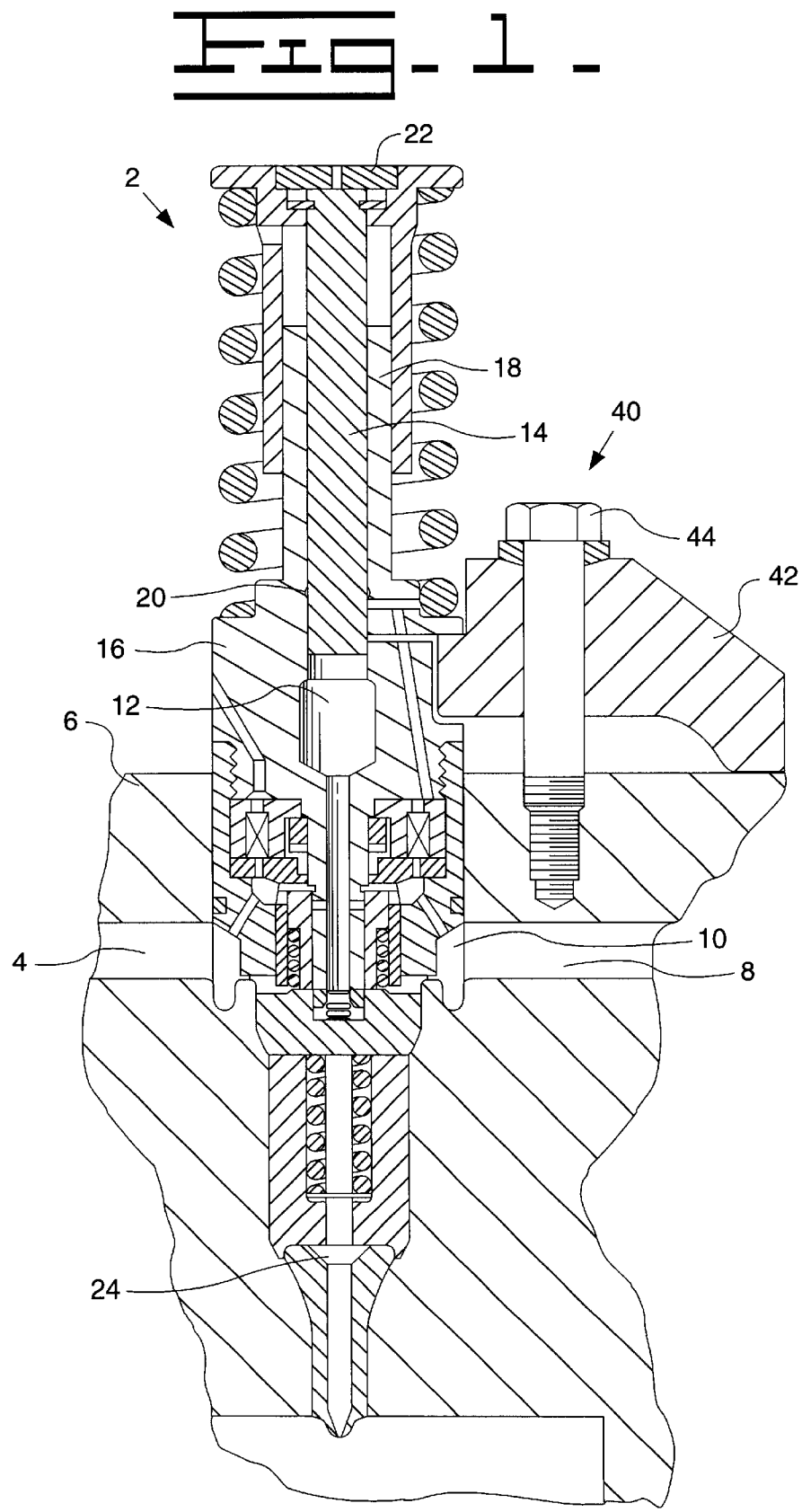
FIG. 1 is a diagrammatic cross-sectional view of a mechanically actuated electronically controlled unit injector.

Referring to FIG. 1, a typical fuel injector 2 is mounted in a generally cylindrical bore 16 in an engine block 6 via a mounting assembly 40. The mounting assembly 40 includes a clamp 42 and a bolt 44 which threadably secures the clamp 42 to the engine block 6.

Fuel is provided to the fuel injector 2 via a fuel supply conduit 4 formed in the engine block 6, and excess fuel drains from the injector 2 via a fuel return conduit 8. The fluid supply conduit 4 and the fluid drain conduit 8 are fluid interconnected by an annular fuel cavity 10, which surrounds the outer periphery of the fuel injector 2.

The fuel supplied by the fuel supply conduit 4, which is pressurized to a pressure of about 420 MPa (60 psi), periodically flows, between injection cycles, to a generally cylindrical fuel pressurization chamber 12 formed in the center of the fuel injector 2. The fuel in the pressurization chamber 12 is periodically pressurized to a pressure in excess of 140,000 MPa (20,000 psi), and for example to about 210,000 MPa (30,000 psi), by a fuel injector plunger 14 which reciprocates within a cylindrical bore 16, formed in a cylindrical extension 18 of a portion 20 of the fuel injector body.

As the plunger 14 is forced downwards by the rocker arm (not shown) attached to the disk 22, the fuel pressure in the pressurizing chamber 12 increases, and thus the fuel pressure in the nozzle cavity 24, also increases. When the fuel pressure in the nozzle cavity 24 reaches a threshold pressure, the force exerted by the fluid pressure causes the nozzle check 26 to be forced upwards, thus opening the nozzle and causing fuel to be injected.

Figure 2:
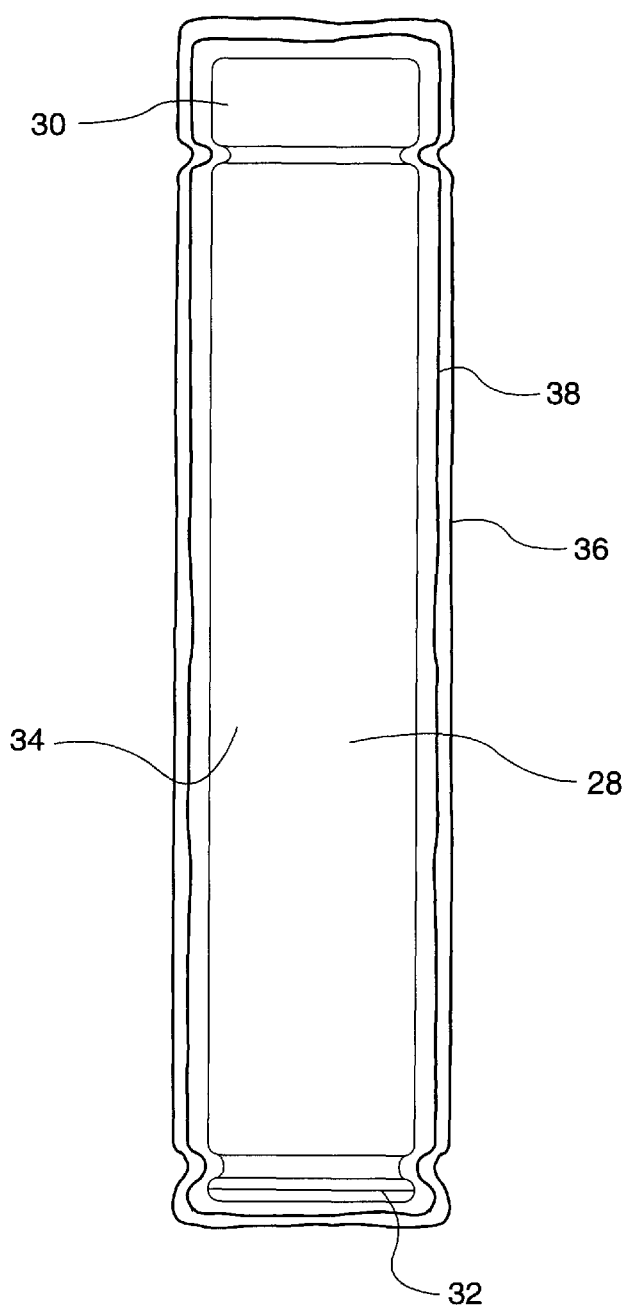
FIG. 2 is a side view of a coated fuel injection plunger in accordance with the present invention.

Turning now to FIG. 2, there is shown a side view of a coated fuel injector plunger in accordance with the present invention. As seen in FIG. 2, the illustrated fuel injector plunger 14 includes a main body section 28, a plunger end section 30, and a loading end section 32.

The various sections of the fuel injector plunger are formed or machined from a low alloy steel substrate 34. The term "low alloy" as used herein means a steel grade in which the hardenability elements, such as manganese, chromium, molybdenum and nickel, collectively constitute less than about 3.5% by weight of the total steel composition. A low alloy steel substrate 34 is preferable for many fuel injector components, including the fuel injector plunger 14 and fuel injector barrel (not shown), from an economic and reliability standpoint.

Composition of the primary coating 36 is preferably selected from the group consisting of metal nitrides, and in particular, chromium nitride, zirconium nitride, molybdenum nitride, titanium-carbon-nitride, or zirconium-carbon-nitride. Alternatively, the primary coating 36 is selected from the group consisting of metal carbon materials such as titanium containing diamond like carbon (DLC), tungsten-DLC, or chromium-DLC. The preferable metal carbon material is tungsten-carbide containing carbon. Where tungsten-carbide containing carbon is used the tungsten content is graded, and thus may range at any given layer of between about 0% to about 100%, more preferably between about 15% and about 30%.

Depending on the intended application and environment of the coated fuel injector component, it may be advantageous to apply a bond layer 38 of a chromium layer or other suitable metal layer to the low alloy steel substrate 34 to provide improved adhesion of the primary coating 36, if tungsten-carbide containing carbon is utilized as the primary coating. If used, the optional bond layer material is preferably applied using a similar vapor deposition process to yield a bond layer 38 having a thickness of generally between about 0.05 micron and 0.5 micron, and more preferably, of about 0.05 micron to about 0.5 micron.

The coating thickness on the fuel injection plunger should be fairly uniform as measured on a sample of the fuel injector components by the Ball Crater Test at a plurality of locations on the plunger. Alternatively one can demonstrate uniform coating thickness through scanning electron microscopy measurements on a sample of selected cross sections of the fuel injector plungers, or through the use of X-ray fluorescence.

In the preferred embodiment, the primary coating 36 has a thickness desirably no greater than about 5.0 microns and preferably has a thickness of between about 0.5 microns and about 1.7 microns. A primary coating thickness greater than about 5 microns is undesirable because the coating may develop residual stresses high enough to separate the primary coating 36 from bond layer 38 or substrate 34. The primary coating may be applied to the entire length of the plunger or the coating may be applied partially, depending upon the actual plunger model used. In order to apply a partial coating, the plunger is held by a small cup (¼" high) with a slightly larger diameter to hold the plunger in place. Alternatively, the plunger may be held in place by a magnet to partially coat the plunger.

The chromium bond layer 38 has a thickness desirably no greater than about 1.0 micron and preferably has a thickness of between about 0.1 micron and 1.0 micron and most preferably between about 0.1 and 0.3. As with the primary coating 36, a bond layer thickness greater than about 1.0 micron is undesirable because the bond layer 38 may develop residual stresses high enough to separate from the substrate 20.

Control of some or all of the physical properties of the coatings and coated substrate other than thickness are also important to producing a highly reliable and cost effective component. For example, coating adhesion, coating hardness, substrate hardness, surface texture, frictional coefficients, are some of the physical properties that should be monitored. Although different applications may demand different physical properties, the following discussion discloses some of the properties in the preferred embodiments.

As indicated above, the applied coatings should be generally free of surface defects and have a specified surface texture ratings or surface texture measurements dependent on the intended use of the component. Surface defects are generally observed on a sample of the fuel injector plungers coated through the observation of multiple points on the surface of the samples at about 100 times magnification factor. The surface observations are generally compared to various classification standards to ensure the coatings are substantially free from surface defects as opposed to pin holes and substrate defects.

In addition, the applied coatings should generally adhere to the steel substrate. Coating adhesion can be assessed for a given population of fuel injector plungers, for example, by using standard hardness tests (e.g. Rockwell C HDNS measurements). The impact locations on the surface are observed and generally compared to various adhesion classification standards based on the size and amount of cracks present and the flaking of the coatings.

In the disclosed embodiment, the coating hardness is also important characteristic of the fuel injector plunger. Preferably, the applied tungsten-carbide containing carbon coating maintains a hardness of greater than 1000 $Kg/mm^2$ as measured using a Hardness Knoop HDNS 50 gram load. Alternatively, the applied CrN coating maintains a hardness of greater than 1500 $Kg/mm^2$ as measured using a Hardness Knoop HDNS 50 gram load. In both disclosed embodiments, the substrate hardness after the coating process is preferably 75–79 RKW using a 30N hardness tester.

In the preferred embodiment, the coated low alloy steel part desirably has a boundary lubricity value greater than the boundary lubricity value of said low alloy steel substrate as measured using the ISO 12156, version 1.3 HFRR(High Frequency Reciprocating Rig).

In the preferred embodiment, the coated low alloy steel part desirably has a friction coefficient no more than about 0.5 or less, whereas the friction coefficient of the non-oxidized, non-coated low alloy steel component is 0.5, and preferably the coated part has a friction coefficient no more than about 0.2 or less. It is desirable that the friction coefficient is no more than about 0.2 or less because the beneficial effects of enhanced boundary lubrication will be offset by a substantial increase in the friction coefficient.

Although not shown, it is readily understood by those skilled in the art that in addition to coating fuel injector plungers, it would be equally advantageous to provide a coating to the component with which the fuel injector plunger surfaces contact, namely the fuel injector barrel. Coating of the contacting surfaces of the fuel injector barrel and other fuel injector components with metal nitride and diamond like carbon coatings having similar physical characteristics is advantageous not only from the added lubrication and reduced scuffing realized on the coated component, but also from the viewpoint of controlling the wear patterns of contacting surfaces, as explained herein.

Any one of the vapor deposition techniques, such as physical vapor deposition (e.g. sputtering), chemical vapor deposition and arc vapor deposition or hybrids thereof, can be employed to deposit the coatings on the low alloy steel substrate. In the preferred embodiment, the chromium nitride(CrN) coating is deposited by an arc vapor deposition (AVD) process.

In general, in arc vapor deposition, the arc source is adapted to impart a positive charge on the vapor generated. A negative bias voltage of a selected voltage (e.g. 50 Volts) is applied to the substrate by a voltage source. A vapor deposition coating is deposited on the target substrate. Such arc vapor deposition coating methods, utilizing an arc source to impart a positive charge on the vapor generated and a negative bias voltage to impart a negative charge on the substrate, are generally known in the art.

However, in the preferred embodiment with tungsten-carbide containing carbon, sputtering is the preferred method used to apply the tungsten-carbide containing carbon coating because it allows control over the amount of tungsten carbide in the coating. As previously stated, the bond layer of Chromium, utilized in conjunction with the tungsten-carbide containing carbon coating can be applied by sputtering or AVD, preferably AVD.

The low alloy steel part is formed from a non-oxidized steel substrate that has been cleaned and prepared to facilitate bonding with the preferred coating or bond layer or both. Prior to coating, the cleaning and the preparation of the steel substrate can be accomplished by conventional methods such as degreasing, grit blasting, etching, chemically assisted vibratory techniques, and the like. Such surface finishing techniques are well known to those skilled in the art. The preferred substrate surface finishing operations performed prior to the coating application include a grinding process to obtain a highly smooth surface, ultrasonic cleaning with an alkaline solution, and ion-etching of the substrate surface using argon. In addition, all heat treatment operations specified for the component are performed prior to coating application.

In the preferred embodiment, the coating process further comprises the step of forming a solid lubricant coating on the substrate by arc vapor deposition or sputtering process. As indicated above, the preferred coatings are chromium nitride (CrN) or tungsten carbide containing carbon because such coatings result in improved boundary lubrication with a reduction in friction of the lubricated contact. Arc vapor deposition (AVD) is the preferred method of depositing the CrN coatings on the low alloy steel substrate because the AVD process is carried out at temperatures in the range of 150–250° C. or other temperatures which are below the tempering temperature of the selected low alloy grade steels. Thus, during the coating process, the hardness of the substrate and component are generally unaffected by the coating procedure. The finished coating is preferably a uniform thickness (e.g. between about 0.5 micron and about 1.7 microns), smooth, adherent and free from visible defects.

As previously stated, sputtering is the preferred method used to apply the tungsten-carbide containing carbon coating because it allows control over the amount of tungsten carbide in the coating. As previously stated, the bond layer of Chromium, utilized in conjunction with the tungsten-carbide containing carbon coating can be applied by sputtering or AVD, preferably AVD.

FIG. 3 depicts the hydraulically actuated electronically controlled unit injector of this invention. Like FIG. 1, a typical fuel injector 2 is shown. Unlike FIG. 1, the fuel injector 2 shown in FIG. 3 is hydraulically actuated. Included in the assembly are a valve 46, a piston 48, a fuel injector plunger 14, and a nozzle check 26. The valve 46 is opened during engine operation to allow oil to flow into the fuel injector 2. The oil pressure pushes on the top of the piston 48 forcing it down similar to the rocker arm of the mechanically actuated electronically controlled unit injector. The piston 48 propels the fuel injector plunger 14, which pressurizes the fuel in the lower part of the fuel injector 2. When the fuel pressure reaches a threshold value, the nozzle check 26 is forced upwards, thus opening the nozzle and causing fuel to be injected.

INDUSTRIAL APPLICABILITY

The disclosed coatings for fuel injector components, such as fuel injector plungers and fuel injector barrels, are particularly useful in highly loaded, marginally lubricated fuel injection system applications where component scuffing and high wear are typically encountered.

The component comprises a steel substrate and diamond like carbon primary coating (e.g. tungsten carbide containing carbon) deposited on the substrate. The primary coating has a thickness generally no greater than about 5 microns and more preferably, a thickness of between about 0.5 microns and about 1.7 microns.

Optionally, a bond layer of chromium or other suitable metal is applied to improve the adhesion properties of the primary coating to the substrate. Applying a bond layer between the steel substrate and the primary coating is generally known in art. The bond layer has a thickness of less than 0.50 microns and more preferably of between about 0.05 microns and about 0.50 microns. The actual thickness and other physical property characteristics of the coating are preferably tailored to the application and environment in which the fuel injection system is to be used.

The invention may also be characterized as a chromium nitride (CrN) coated low alloy steel component for a fuel injection system having improved boundary lubrication characteristics, and improved scuffing resistance characteristics are disclosed. The component comprises a steel substrate and a chromium nitride coating deposited on the substrate. The coating has a thickness generally no greater than about 5.0 microns and more generally between about 0.5 and about 1.7 microns. As with the diamond like carbon coated components, the actual thickness and other physical property characteristics of the chromium nitride coating are preferably tailored to the application and environment in which the fuel injection system is to be used.

In particular, a coating is formed on the low alloy steel substrate by low temperature vapor deposition process such as sputtering or arc vapor deposition using coatings selected from the group consisting of metal nitrides and diamond like carbon materials such as chromium nitride (CrN) and tungsten carbide containing carbon, respectively.

The result is a chromium nitride coated low alloy steel component or tungsten carbide containing carbon coated low alloy steel component for a fuel injection system formed having improved scuffing resistance characteristics over the non-oxidized low alloy steel part.

The use of the disclosed component coatings in such hostile fuel injection system applications provides advantages even after such coatings wear away. As may be expected, even the disclosed fuel injector component coatings wear over time and after continual use. However, as the coatings wear, the contacting surfaces of the underlying substrates exhibit corresponding wear patterns. Thus, even after the component coatings are no longer present, the contacting steel surfaces of the previously coated fuel injector components exhibit only marginal amounts, if any, scuffing.

In other words, even if the disclosed coatings wear away gradually, there is little or no scuffing problem between mating components because the mating surfaces are worn in such a way that the steel to steel interface is not highly frictional to cause scuffing. Thus, the disclosed coatings provide the added benefit of protecting the components from scuffing (a form of wear) much the same as a break-in coating would protect contacting surfaces.

The illustrative example, as set forth below, shows the beneficial effect of the metal nitride coatings and diamond like carbon coatings deposited by arc vapor deposition or sputtering on a low alloy steel.

EXAMPLES

The following Examples will serve to further typify the nature of the invention but should not be construed as a limitation on the scope thereof.

Accelerated scuffing and seizure tests were performed on a Caterpillar fuel injector plunger operating within a Caterpillar Fuel Injector. The fuel injector plungers included at least one with a chromium nitride coating and at least one having a tungsten carbide containing carbon coating and were compared to scuffing and seizure tests for a baseline Caterpillar fuel injector plunger having no coating. The Caterpillar Fuel Injectors were testing using direct injection of a low lubricity fuel and direct injection of water.

The fuel used was Caterpillar fuel 1E2820, which is a low lubricity diesel fuel. 18 plungers were utilized per test. The plunger part number used was #1124312, and the injector part number was #146-1891. The plungers were tested for three hours.

An additional performance test, ET213, was completed on 6 injectors. This test is a 1000 hours endurance test using the same fuel, 1E2820, as cited above.

The chromium nitride coated fuel injector plunger demonstrated very good scuff resistance when pumping the low lubricity fuel and slightly improved scuffing resistance when injecting pure water as compared to the non-coated fuel injector plunger. The tungsten carbide containing carbon coated fuel injector plunger, on the other hand, demonstrated very good scuffing resistance when pumping either the low lubricity fuel as well as pure water. Comparative test results are given in the following table.

| Test Sample | Low Lubricity Fuel | Pure Water |
| --- | --- | --- |
| Baseline Non-Coated Steel Fuel Injector Plunger | 100% Scuffed | 75% Scuffed |
| Chromium Nitride Coated Fuel Injector Plunger | Minimal Scuffing (Less Than 2%) | 73% Scuffed |
| Tungsten Carbide/Carbon Coated Fuel Injector Plunger | Minimal Scuffing (Less Than 2%) | Minimal Scuffing (Less Than 2%) |

From the foregoing, it should be appreciated that the present invention thus provides a coating or surface treatment for fuel injection system components such as fuel injector plungers. While the invention herein disclosed has been described by means of specific embodiments and processes associated therewith, numerous modifications and variations can be made thereto by those skilled in the art without departing from the scope of the invention as set forth in the claims or sacrificing all its material advantages.

What is claimed is:

1. A fuel injector assembly comprising:

an injector body defining a cylindrical bore;

a fuel injector plunger being positioned within the cylindrical bore, said fuel injector assembly being hydraulically actuated and reciprocated by moving said fuel injector plunger between an open position and a closed position, said fuel injector plunger being made from a low alloy steel substrate and having a coating thereon; and said coating having a pre-established thickness, said pre-established thickness being in the range of between about 0.5 and 5.0 microns and being composed of a deposited primary coating.

2. The fuel injector assembly of claim 1 wherein said pre-established thickness of said primary coating ranges between about 0.5 to about 1.7 microns.

3. The fuel injector assembly of claim 1 wherein said low alloy steel substrate defines a boundary lubricity value and the coating defining said boundary lubricity value wherein said boundary lubricity value of said coating on said fuel injector plunger is greater than the boundary lubricating value of said low alloy steel substrate as measured using the ISO 12156 version 1.3 HFRR.

4. The fuel injector assembly of claim 1 wherein said coating defines a friction coefficient and said friction coefficient of said coating on said fuel injector plunger is less than 0.5.

5. The fuel injector assembly of claim 1 wherein said coating is selected from the group consisting of chromium nitride, zirconium nitride, molybdenum nitride, titanium-carbon-nitride, or zirconium-carbon-nitride.

6. The fuel injector assembly of claim 5 wherein said coating is chromium nitride.

7. The fuel injector assembly of claim 6 wherein said coating defines a hardness and said hardness is greater than 1500 Kg/mm$^2$ as measured using a Hardness Knoop HDNS 50 gram load.

8. The fuel injector assembly of claim 1 wherein said coating is selected from the group consisting of titanium containing diamond like carbon, chromium containing diamond like carbon, or tungsten containing diamond like carbon.

9. The fuel injector assembly of claim 8 wherein said coating is tungsten containing diamond like carbon.

10. The fuel injector assembly of claim 9 wherein said coating defines a hardness and said hardness is greater than 1000 Kg/mm$^2$ as measured using a Hardness Knoop HDNS 50 gram load.

11. The fuel injector assembly of claim 1 wherein said low alloy steel substrate is composed of a steel grade having hardenability elements in which said hardenability elements collectively constitute less than about 3.5% by weight of said low alloy steel substrate.

12. The fuel injector assembly of claim 1 wherein said coating defines a scuffing resistance characteristic and the low alloy steel substrate defines a scuffing resistance characteristic and said scuffing resistance characteristic of said coating is greater than the scuffing resistance characteristic of said low alloy steel substrate.

13. The fuel injector assembly of claim 1 further comprising a bond layer being between said low alloy steel substrate and said coating.

14. The fuel injector assembly of claim 13 wherein said bond layer is a chromium layer having a thickness in the range of between about 0.05 and 0.50 microns.

15. A method for increasing a boundary lubricity value at the interface of a low alloy steel substrate reciprocatably positioned in contacting relation to an injector body of a hydraulically actuated fuel injector assembly comprising:
preparing a fuel plunger being made of a low alloy steel substrate;
depositing a primary coating on said low alloy steel substrate using a low temperature physical deposition process said coating having a pre-established thickness, said pre-established thickness being in the range of between about 0.5 and 5.0 microns.

16. The method of claim 15 wherein said low alloy steel substrate is a steel grade having hardenability elements said hardenability elements collectively constitute less than about 3.5% by weight of said low alloy steel substrate.

17. The method of claim 15 wherein the thickness of said primary coating ranges between about 0.5 to about 1.7 microns.

18. The method of claim 15 wherein said coating is selected from the group consisting of titanium containing diamond like carbon, chromium containing diamond like carbon, or tungsten containing diamond like carbon.

19. The method of claim 18 further comprising a bond layer being between said low alloy steel substrate and said coating.

20. The method of claim 19 wherein said bond layer is a chromium layer having a thickness in the range of between about 0.05 and 0.50 microns.

21. The method of claim 15 wherein said coating is selected from the group consisting of chromium nitride, zirconium nitride, molybdenum nitride, titanium-carbon-nitride, or zirconium-carbon-nitride.

22. The method of claim 21 further comprising a bond layer between said low alloy steel substrate and said coating.

23. The method of claim 22 wherein said bond layer is a chromium layer having a thickness in the range of between about 0.05 and 0.50 microns.

24. A component of a fuel injection system comprising:
a low alloy steel substrate;
a coating on said low alloy steel substrate, said coating selected from the group consisting of chromium nitride, zirconium nitride, molybdenum nitride, titanium-carbon-nitride, or zirconium-carbon-nitride;
wherein said component is adapted to be exposed to a fluid within said fuel injection system and said component is further moveable within said fuel injection system relative to an adjacent component within said fuel injection system.

25. The component of said fuel injection system of claim 24 wherein said component is adapted to control the flow of said fluid.

26. The component of said fuel injection system of claim 25 wherein said component is a fuel injector plunger.

27. The component of said fuel injection system of claim 25 wherein said fluid is fuel.

28. The component of said fuel injection system of claim 24 wherein said coating has a thickness being in the range of between about 0.5 and 5.0 microns.

29. The component of said fuel injection system of claim 25 wherein said coating is chromium nitride.

30. The component of said fuel injection system of claim 24 further comprising a bond layer being between said low alloy steel substrate and said coating.

31. The component of said fuel injection system of claim 30 wherein said bond layer is a chromium layer having a thickness in the range of between about 0.05 and 0.50 microns.

32. The component of said fuel injection system of claim 24 wherein said coating defines a friction coefficient of less than 0.5.

33. A component in a fuel injection system comprising:
a low alloy steel substrate;
a coating on said low alloy steel substrate, said coating selected from the group consisting of titanium containing diamond like carbon, chromium containing diamond like carbon, or tungsten containing diamond like carbon,
wherein said component is adapted to be exposed to a fluid within said fuel injection system and said component is further moveable within said fuel injection system relative to a second component.

34. The component of said fuel injection system of claim 33 wherein said component is adapted to control the flow of said fluid.

35. The component of said fuel injection system of claim 34 wherein said component is a fuel injector plunger.

36. The component of said fuel injection system of claim 34 wherein said fluid is fuel.

37. The component of said fuel injection system of claim 33 wherein said coating has a thickness being in the range of between about 0.5 and 5.0 microns.

38. The component of said fuel injection system of claim 33 wherein said coating is tungsten containing diamond like carbon.

39. The component of said fuel injection system of claim 33 further comprising a bond layer being between said low alloy steel substrate and said coating.

40. The component of said fuel injection system of claim 39 wherein said bond layer is a chromium layer having a thickness in the range of between about 0.05 and 0.50 microns.

41. The component of said fuel injection system of claim 37 wherein said coating defines a friction coefficient of less than 0.5.

* * * * *